(12) United States Patent
Na et al.

(10) Patent No.: US 10,779,409 B2
(45) Date of Patent: Sep. 15, 2020

(54) PRINTED CIRCUIT BOARD

(71) Applicant: Samsung Electro-Mechanics Co., Ltd., Suwon-si (KR)

(72) Inventors: Byung-Duk Na, Suwon-si (KR); Hye-Won Jung, Suwon-si (KR); Jae-Sung Sim, Suwon-si (KR); Mi-Sun Hwang, Suwon-si (KR); Hee-Joon Chun, Suwon-si (KR); Deok-Man Kang, Suwon-si (KR); Sun-A Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/674,507

(22) Filed: Nov. 5, 2019

(65) Prior Publication Data

US 2020/0154568 A1   May 14, 2020

(30) Foreign Application Priority Data

Nov. 13, 2018  (KR) .................. 10-2018-0139076

(51) Int. Cl.
| H05K 1/11 | (2006.01) |
| H05K 3/40 | (2006.01) |
| H05K 1/05 | (2006.01) |
| H05K 1/03 | (2006.01) |
| H05K 1/02 | (2006.01) |

(52) U.S. Cl.
CPC ........... *H05K 1/116* (2013.01); *H05K 1/0298* (2013.01); *H05K 1/0366* (2013.01); *H05K 1/05* (2013.01); *H05K 3/4038* (2013.01)

(58) Field of Classification Search
CPC ........ H05K 1/112; H05K 1/113; H05K 1/115; H05K 1/116; H05K 1/184; H05K 3/4038
See application file for complete search history.

(56) References Cited

U.S. PATENT DOCUMENTS

| 5,444,189 | A | * | 8/1995 | Nakaso | ................... H05K 1/116 174/255 |
| 6,585,903 | B1 | * | 7/2003 | Belke, Jr. | ............. H05K 3/4038 174/262 |
| 9,084,379 | B2 | * | 7/2015 | Chen | .................... H05K 3/0032 |
| 2010/0307807 | A1 | * | 12/2010 | Noda | ..................... H05K 1/115 174/264 |

FOREIGN PATENT DOCUMENTS

| JP | 2014-027163 A | 2/2014 |
| KR | 10-2015-0026901 A | 3/2015 |
| KR | 10-2015-0049008 A | 5/2015 |

\* cited by examiner

*Primary Examiner* — Jeremy C Norris
(74) *Attorney, Agent, or Firm* — NSIP Law

(57) ABSTRACT

A printed circuit board including: an insulating material; a metal layer stacked on a surface of the insulating material; and a via hole passing through the metal layer and the insulating material. The metal layer decreases in thickness in a region adjacent to the via hole, and an interface between the insulating material and the metal layer includes a region that is directed toward the via hole.

15 Claims, 7 Drawing Sheets

PRINTED CIRCUIT BOARD

CROSS-REFERENCE TO RELATED APPLICATION

This application claims the benefit under 35 USC 119(a) of Korean Patent Application No. 10-2018-0139076, filed on Nov. 13, 2018, the entire disclosure of which is incorporated herein by reference for all purposes.

BACKGROUND

1. Field

The following description relates to a printed circuit board.

2. Discussion of Background

Due to the miniaturization and thinning of printed circuit boards and the large-scale integration of circuits, improving heat dissipation characteristics is in demand, and thus the number of vias included in a printed circuit board may increase. In processing a via hole, it is necessary to secure a technique other than laser processing.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes: an insulating material; a metal layer stacked on a surface of the insulating material; and a via hole passing through the metal layer and the insulating material. The metal layer decreases in thickness in a region adjacent to the via hole, and an interface between the insulating material and the metal layer includes a region that is directed toward the via hole.

The metal layer may have a smallest thickness in the region adjacent to the via hole.

In a longitudinal section of the metal layer, a portion of the metal layer closest to the via hole may be sharp.

An inner side surface of the metal layer facing the via hole may include an outwardly convex curved surface.

The interface between the insulating material and the metal layer may be disposed at a lowest position of the interface closest to the via hole.

The interface between the insulating material and the metal layer may include an outwardly convex curved surface that is directed toward the via hole.

An inner side surface of the via hole passing through the insulating material may include a concave curved surface.

The printed circuit board may include a conductor pattern disposed inside the insulating material and in contact with the via hole, and the via hole may pass through a surface of the conductor pattern.

The surface of the conductor pattern may include a curved surface.

The curved surface of the conductor pattern may have a concave shape.

The printed circuit board may include an electroless plating layer continuously disposed on a surface of the metal layer, an inner side surface of the via hole, and the surface of the conductor pattern; and an electroplating layer disposed on the electroless plating layer.

The insulating material may include a fiber reinforcing material, and the fiber reinforcing material may not protrude inside of the via hole.

The via hole may include at least one surface substantially perpendicular to a planar direction of the insulating material.

The printed circuit board may include a conductor pattern disposed inside the insulating material and in contact with the via hole, and a surface of the conductor pattern through which the via hole passes may include a flat surface.

In another general aspect, a printed circuit board includes: an insulating material having a lower conductor pattern disposed therein; a via connected to the lower conductor pattern through the insulating material; and an upper conductor pattern disposed on an upper surface of the insulating material, wherein the upper conductor pattern includes: a ring-shaped metal layer disposed on the upper surface of the insulating material; an electroless plating layer disposed on an inner side surface and an upper surface of the metal layer; and an electroplating layer disposed on the electroless plating layer, wherein the metal layer decreases in thickness in a region adjacent to the via, and an interface between the insulating material and the metal layer includes a region that is downwardly directed toward the via.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
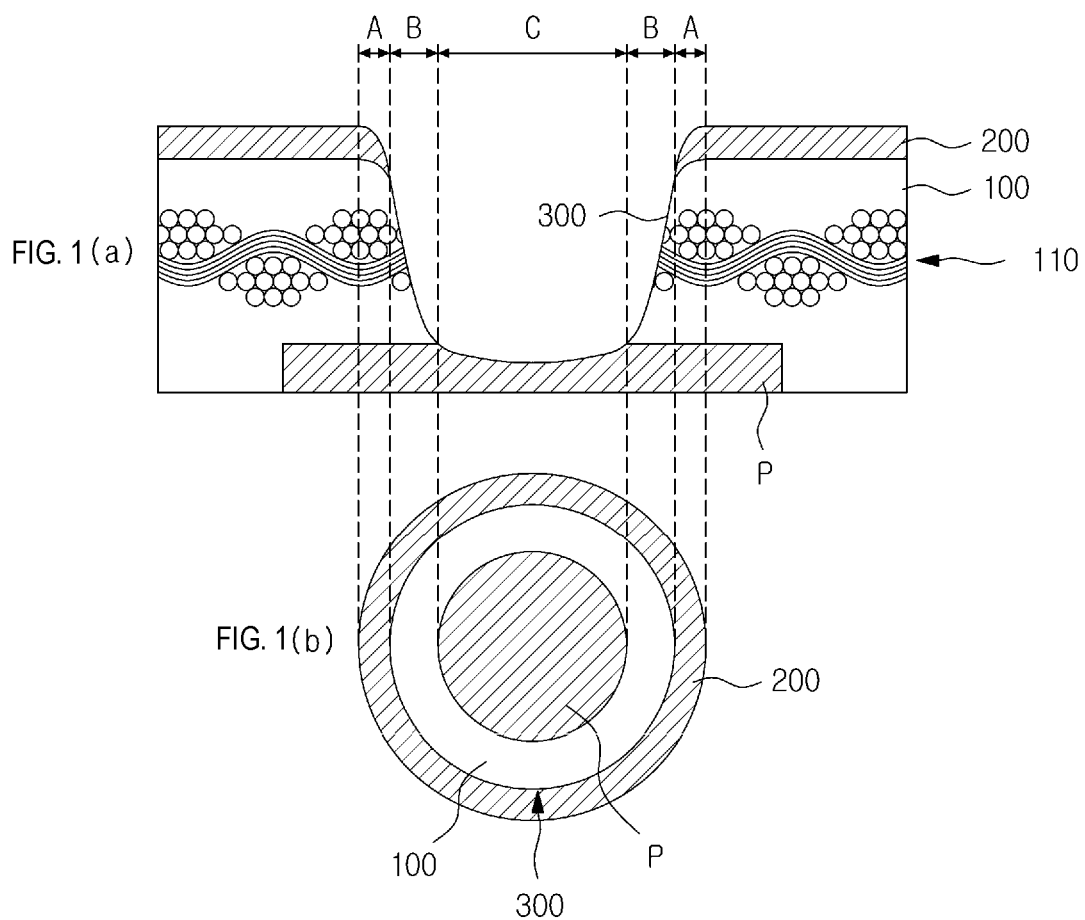
FIGS. 1(a) and 1(b) are diagrams showing a printed circuit board according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
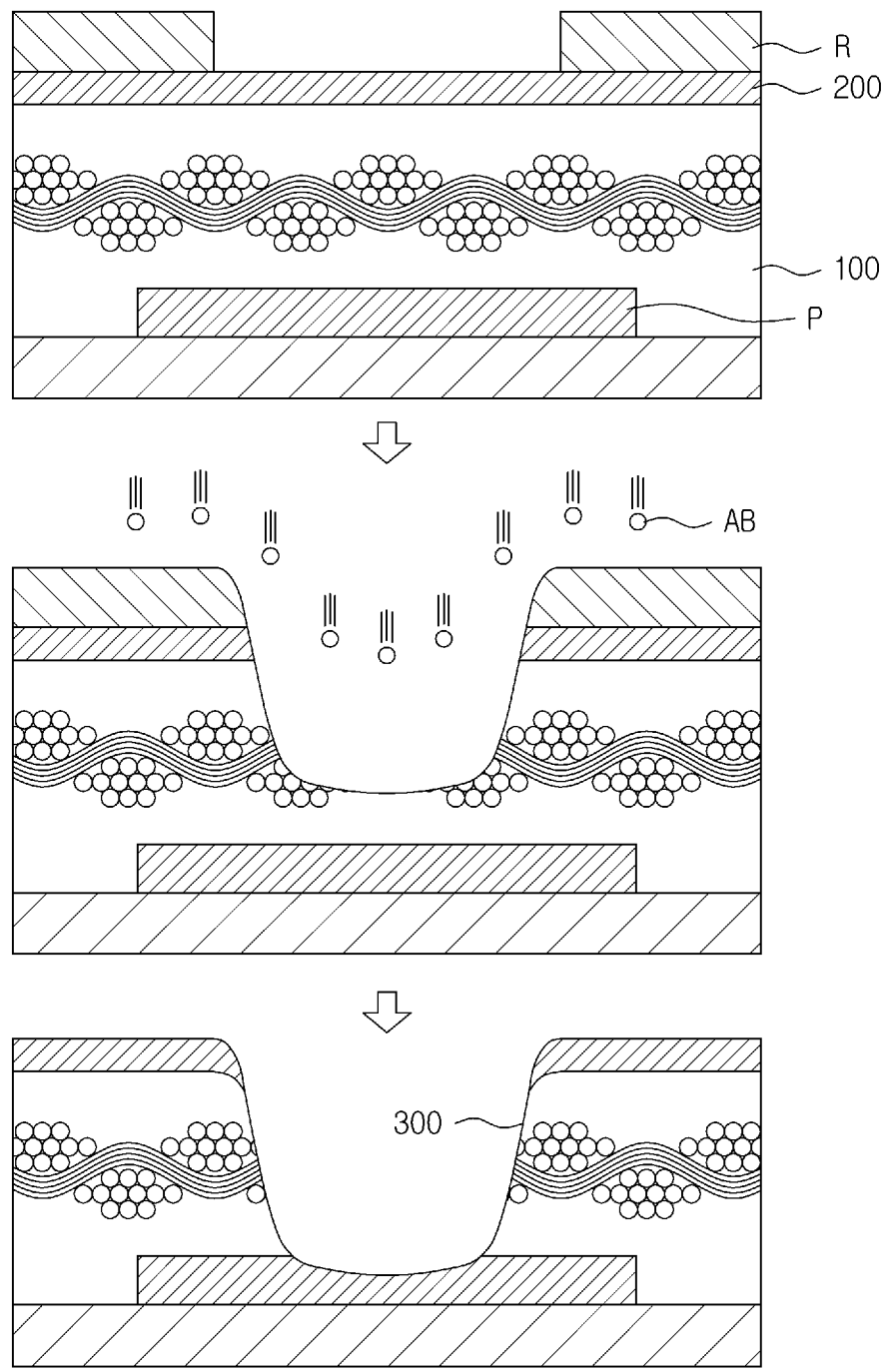
FIG. 2 is a diagram showing a method of manufacturing a printed circuit board according to an example.

FIG. 1(a) is a diagram showing a printed circuit board (PCB) according to an example. FIG. 1(b) is a top view of the PCB shown in FIG. 1(a). FIG. 2 is a diagram showing a method of manufacturing a PCB according to an example.

Referring to FIGS. 1(a) and 1(b), the PCB may include an insulating material 100, a metal layer 200, and a via hole 300.

The insulating material 100 is an element for insulating circuits of the PCB from each other. The insulating material 100 may include a resin as a main component. The resin of the insulating material 100 may be selected from among thermosetting resins, thermoplastic resins, and the like. The resin of the insulating material 100 may be an epoxy resin, polyimide, liquid crystal polymer (LCP), or the like. The epoxy resin may be a naphthalene type epoxy resin, a bisphenol A type epoxy resin, a bisphenol F type epoxy resin, a novolac type epoxy resin, a cresol novolac type epoxy resin, a rubber-modified epoxy resin, a cyclic aliphatic type epoxy resin, a silicon-based epoxy resin, a nitrogen-based epoxy resin, a phosphorus-based epoxy resin, or the like, but the composition of the insulating material 100 is not limited thereto.

The insulating material 100 may contain a fiber reinforcing material 110. The fiber reinforcing material 110 contained in the insulating material 100 may be glass cloth and may include a glass filament, a glass fiber, a glass fabric, or the like. The fiber reinforcing material 110 may be located on the center surface of the insulating material 100 and may be in the form of a twist fabric formed by weaving a plurality of fibers. The insulating material 100 including glass cloth may be pre-preg, Ajinomoto build-up film (ABF), or the like.

The insulating material 100 may contain inorganic fillers. As the inorganic fillers, any one selected from silica ($SiO_2$), barium sulfate ($BaSO_4$), and alumina ($Al_2O_3$) may be used alone, or two or more thereof may be used in combination. In addition, calcium carbonate, magnesium carbonate, fly ash, natural silica, synthetic silica, kaolin, clay, calcium oxide, magnesium oxide, titanium oxide, zinc oxide, calcium hydroxide, aluminum hydroxide, magnesium hydroxide, talc, mica, hydrotalcite, aluminum silicate, magnesium silicate, calcium silicate, calcined talc, wollastonite, potassium titanate, magnesium sulfate, calcium sulfate, magnesium phosphate, and the like may be included as the inorganic fillers, but the composition of the insulating material 100 is not limited thereto.

The insulating material 100 may have a thickness of 100 μm or less.

A conductor pattern P is formed inside the insulating material 100. The conductor pattern P may be buried in a lower surface of the insulating material 100, and the remaining surfaces of the conductor pattern P other than the lower surface may be in contact with the insulating material 100. The conductor pattern P has a side surface connected to the circuit and an upper surface connected to the via hole 300.

The conductor pattern P may be formed of a metal such as copper (Cu), silver (Ag), palladium (Pd), aluminum (Al), nickel (Ni), titanium (Ti), gold (Au), and platinum (Pt) or an alloy thereof.

The metal layer 200 is stacked on an upper surface of the insulating material 100 and may be formed of a metal such as copper (Cu), silver (Ag), palladium (Pd), aluminum (Al), nickel (Ni), titanium (Ti), gold (Au), and platinum (Pt) or an alloy thereof. The metal layer 200 may be formed of the same metal as the conductor pattern P.

The thickness of the metal layer 200 may be one fiftieth that of a thickness of the insulating material 100 and may be less than or equal to 18 μm.

The via hole 300 passes through the insulating material 100 and the metal layer 200. The via hole 300 is located on and connected to the conductor pattern P. The via hole 300 may have an upper diameter of 20 μm to 100 μm.

Referring to FIG. 2, the metal layer 200 is stacked on the upper surface of the insulating material 100, patterning is performed after a resist R is applied thereto, and the metal layer 200 and the insulating material 100 are processed at the same time through blasting to form the via hole 300. The blasting may be sandblasting.

The sandblasting is an operation of projecting abrasives AB (micro powder) onto a base to physically process the base. At least one of alumina (Al2O3) and silicon carbide (SiC) may be used as the abrasives AB. A nozzle for spraying the abrasives may be classified into two types, i.e., a slit type and a round type, and the type may be selected depending on the properties of the insulating material 100 and the metal layer 200. Also, equipment for blasting may be classified into a suction type and a direct pressure type, which may be selected depending on the shape of the via hole 300.

When the blasting is performed, the metal layer 200 and the insulating material 100, which are heterogeneous materials, are processed at the same time, and thus it is not necessary to separately remove the metal layer 200 corresponding to the via hole 300 in advance.

Figure 11:
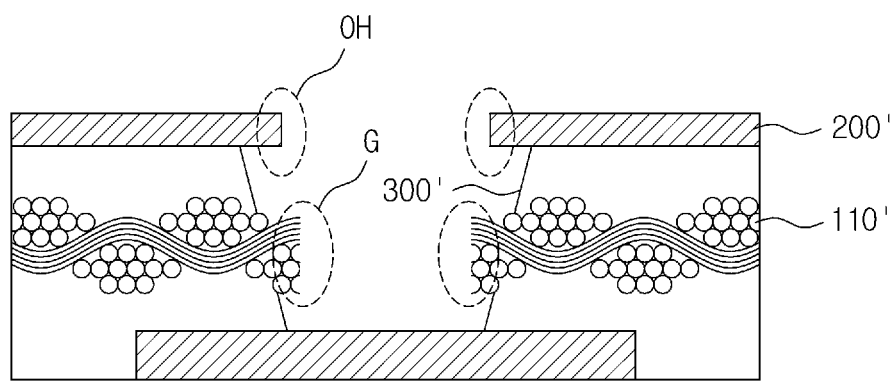
FIG. 11 is a diagram illustrating a via hole formed through conventional laser processing.

On the other hand, during laser processing, as shown in FIG. 11, when a metal layer 200' is processed to have a smaller area than a via hole 300', overhang OH of the metal layer 200' may occur.

However, when the insulating material 100 contains the fiber reinforcing material 110 as in the example of FIG. 1(a), the fiber reinforcing material 110 may not protrude to the inside of the via hole 300 through an inner side surface of the via hole 300. When the blasting is performed, the fiber reinforcing material 110, the insulating material 100, and the metal layer 200, which are heterogeneous materials, may be processed at the same time. The blast processing rates of the heterogeneous materials are similar to each other such that the fiber reinforcing material 110 may not protrude from the inner side surface of the via hole 300.

Meanwhile, during laser processing, as shown in FIG. 11, a fiber reinforcing material 110' may protrude (G) through an inner side surface of the via hole 300'.

Referring back to FIG. 1(a), the inner side surface of the via hole 300 includes a curved surface B, and the curved surface B may have a concave shape.

The via hole 300 may pass through an upper portion of the conductor pattern P. The via hole 300 may partially pass through the conductor pattern P. The upper surface of the conductor pattern P through which the via hole 300 passes may include a curved surface C, and the curved surface C may have a concave shape. The curved surface B of the inner side surface of the via hole 300 may have a different curvature from the curved surface C of the upper surface of the conductor pattern P. Also, the curved surface B of the inner side surface of the via hole 300 and the curved surface C of the upper surface of the conductor pattern P may not be smoothly connected to each other due to bending at a boundary therebetween.

The metal layer 200 includes a region A with a thickness decreasing toward the via hole 300. That is, the metal layer 200 includes a tapered region.

An interface between the insulating material 100 and the metal layer 200 included in the region A is downwardly directed toward the via hole 300. In the longitudinal section of the PCB, the interface between the insulating material 100 and the metal layer 200 is shown as a boundary line, and the boundary line between the insulating material 100 and the metal layer 200 includes a portion that is downwardly directed toward the via hole 300.

The region A where the thickness of the metal layer 200 decreases toward the via hole 300 and the region where the interface between the insulating material 100 and the metal layer 200 is downwardly directed toward the via hole 300 may be perfectly matched. For example, in a predetermined region of the metal layer 200, the thickness of the metal layer 200 may decrease toward the via hole 300, and the interface between the insulating material 100 and the metal layer 200 may be downwardly directed toward the via hole 300.

The region A where the thickness of the metal layer 200 decreases toward the via hole 300 and the region A where the interface between the insulating material 100 and the metal layer 200 is downwardly directed toward the via hole 300 may be peripheral regions of the via hole 300 which are in contact with the via hole 300. That is, the predetermined region may be a peripheral region of the via hole 300 which is in contact with the via hole 300.

The metal layer 200 may have a smallest thickness in a portion closest to the via hole 300. In a longitudinal section of the metal layer 200, the portion closest to the via hole 300 may be sharp. The portion closest to the via hole 300 may be a point in contact with the via hole 300.

An inner side surface of the metal layer 200 facing the via hole 300 may include a curved surface, and the curved surface may have an outwardly convex shape. As shown in FIG. 1(b), the inner side surface of the metal layer 200 may be continuously formed around the circumference of the via hole 300.

As shown in FIG. 1(a), the convex surface of the inner side surface of the metal layer 200 and the concave surface of the inner side surface of the via hole 300 may be smoothly connected to each other with no bending. That is, the point where two curved surfaces meet may be flat or have the same curvature.

The interface between the insulating material 100 and the metal layer 200 may be located at the lowest position in the portion closest to the via hole 300. The portion closest to the via hole 300 may be a point in contact with the via hole 300. The interface between the insulating material 100 and the metal layer 200 may include a curved surface that is downwardly directed toward the via hole 300, and the curved surface may have an outwardly convex shape. The curvature of the curved surface of the interface between the insulating material 100 and the metal layer 200 may be different from the curvature of the curved surface of the inner side surface of the metal layer 200. In the longitudinal section of the PCB, the radius of the curvature of the curved line of the interface between the insulating material 100 and the metal layer 200 may be smaller than the radius of the curvature of the curved line of the inner side surface of the metal layer 200.

Figure 3:
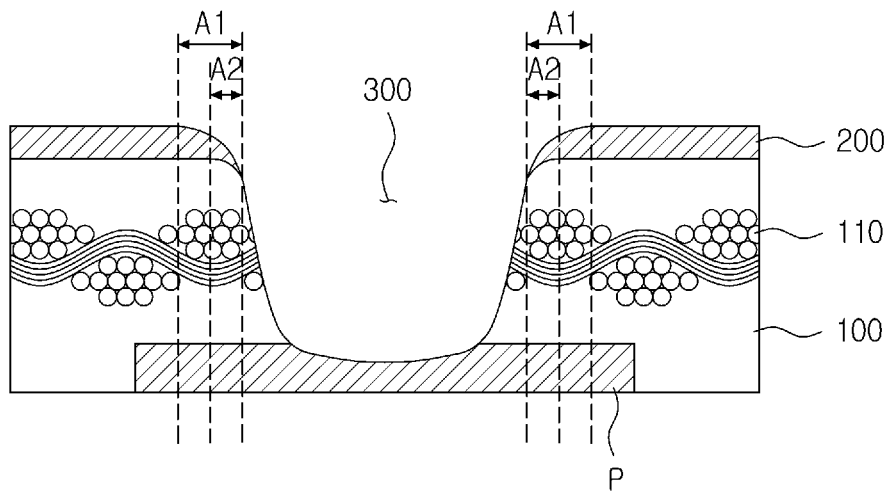
FIGS. 3, 4, 5, 6, 7, and 8 are diagrams showing modifications of the printed circuit board of FIGS. 1(a) and 1(b).
Figure 4:
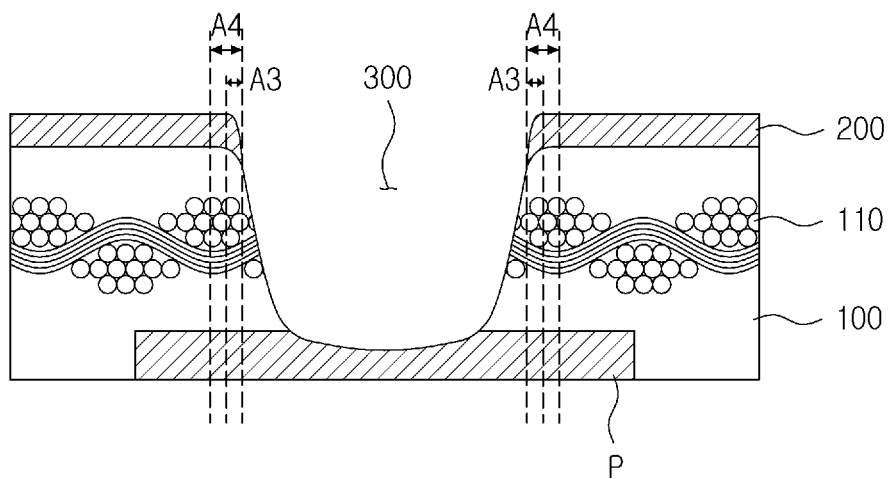

Referring to FIGS. 3 and 4, the region where the thickness of the metal layer 200 decreases toward the via hole 300 and the region where the interface between the insulating material 100 and the metal layer 200 is downwardly directed toward the via hole 300 may differ from, but overlap, each other.

Referring to FIG. 3, the region A1 where the thickness of the metal layer 200 decreases toward the via hole 300 may be wider than the region A2 where the interface between the insulating material 100 and the metal layer 200 is downwardly directed toward the via hole 300. The two regions A1 and A2 overlap each other by the region A2 where the interface between the insulating material 100 and the metal layer 200 is downwardly directed toward the via hole 300.

Referring to FIG. 4, the region A4 where the interface between the insulating material 100 and the metal layer 200 is downwardly directed toward the via hole 300 may be wider than the region A3 where the thickness of the metal layer 200 decreases toward the via hole 300. The two regions A3 and A4 overlap each other by the region A3 where the thickness of the metal layer 200 decreases toward the via hole 300.

As described above, the shape of the metal layer 200 in the vicinity of the via hole 300 may be variously implemented.

Figure 5:
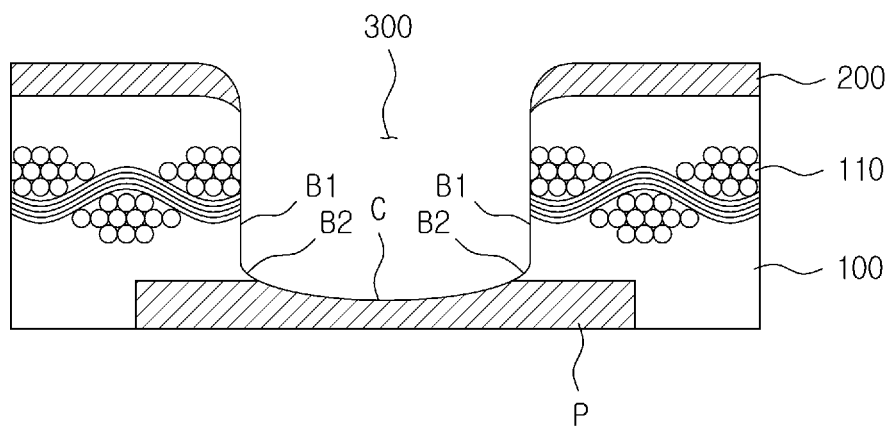

Referring to FIG. 5, the inner side surface of the via hole 300 may include a surface B1 substantially perpendicular to the planar direction of the insulating material 110. The term "substantially perpendicular surface" may mean a side surface of the via hole 300 having an upper surface and a lower surface located on the same line, wherein the ratio of the diameter of the lower surface to the diameter of the upper surface is 80% or higher.

A concave surface B2 of the inner side surface of the via hole 300 may be formed close to the conductor pattern P.

The via hole 300 partially passes through an upper portion of the conductor pattern P, and the upper portion of the conductor pattern P through which the via hole 300 passes may have a concave surface C. The concave surface B2 of the inner side surface of the via hole 300 and the concave surface C of the upper surface of the conductor pattern P may be smoothly connected to each other. That is, at the point where the concave surface B2 of the inner side surface of the via hole 300 and the concave surface C of the upper surface of the conductor pattern P meet, the two curved surface B2 and C may have the same curvature.

Figure 6:
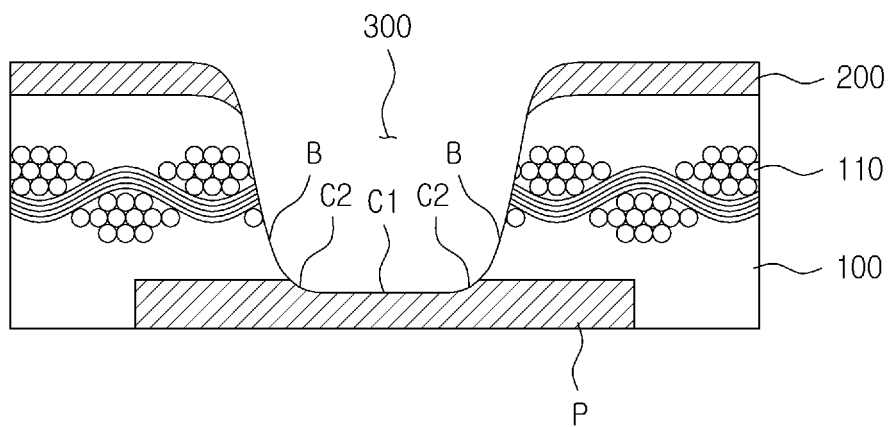

Referring to FIG. 6, the upper surface of the conductor pattern P through which the via hole 300 passes may include may include a flat surface C1. The inner side surface of the via hole 300 may include a concave surface B, the upper surface of the conductor pattern P may include the flat surface C1, and the upper surface of the conductor pattern P may further include a concave surface C2. In this case, a central portion of the upper surface of the conductor pattern P is formed as the flat surface, and a portion close to the inner side surface of the via hole 300 of the upper surface of the conductor pattern P may be formed as the concave surface C2. The concave surface B of the inner side surface of the via hole 300 and the concave surface C2 of the conductor pattern P may have the same curvature at the point where the two surfaces meet.

Figure 7:
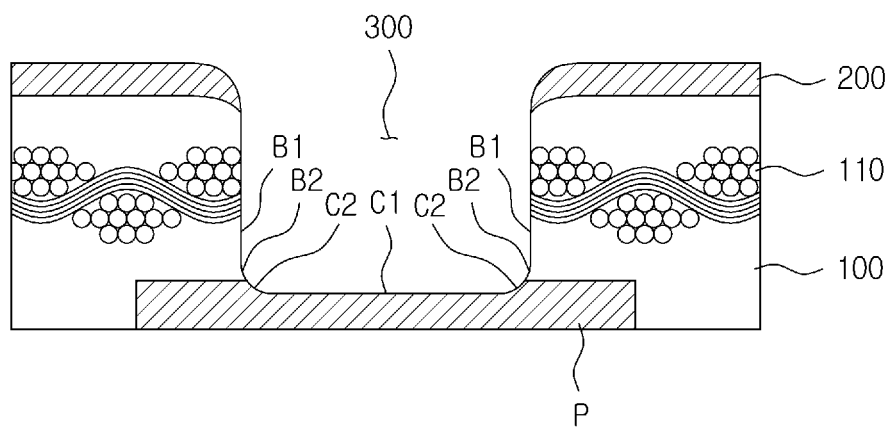

Referring to FIG. 7, the inner side surface of the via hole 300 may include the surface B1 substantially perpendicular to the planar direction of the insulating material 110, and the upper surface of the conductor pattern P through which the via hole 300 passes may include the flat surface C1. The inner side surface of the via hole 300 and the flat surface of the upper surface of the conductor pattern P may be connected by the concave surfaces B2 (as described with respect to FIG. 5) and C2 (as described with respect to FIG. 6).

Figure 8:
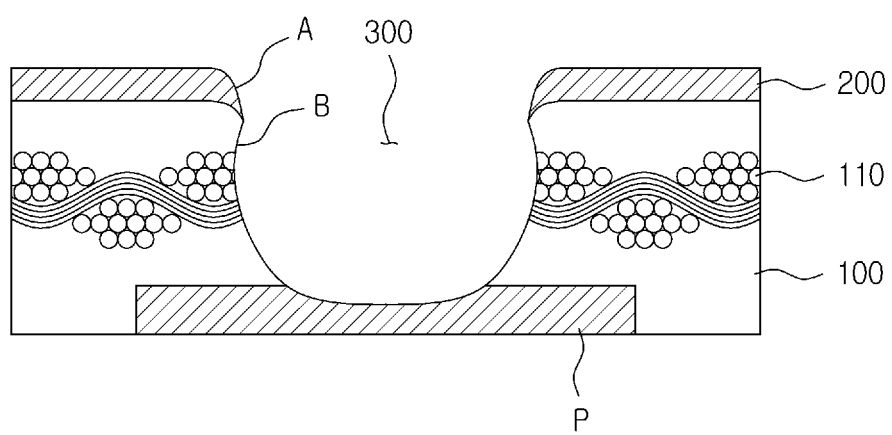

Referring to FIG. 8, the convex surface A of the inner side surface of the metal layer 200 and the concave surface B of the inner side surface of the via hole 300 may not be smoothly connected to each other, and bending may occur in the two curved surfaces. That is, the longitudinal section of the PCB, the point where the two curved surfaces A and B meet may be sharp.

Figure 9:
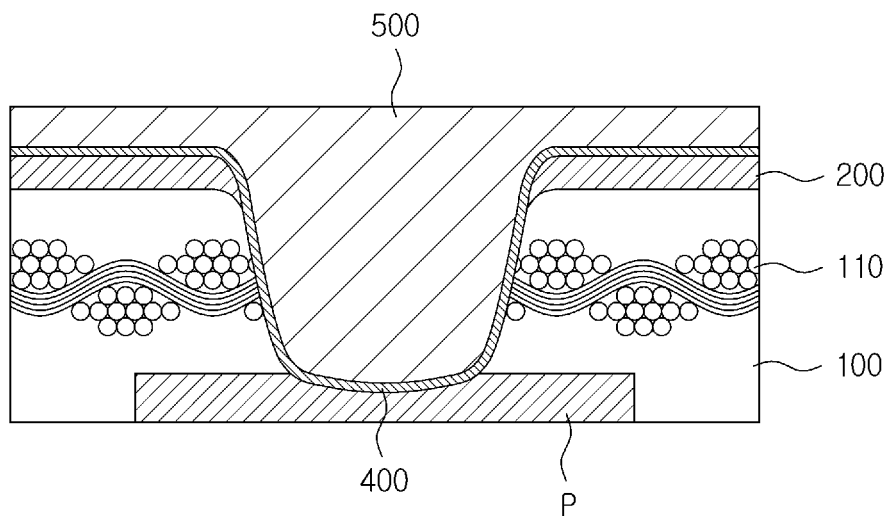
FIG. 9 is a diagram showing a printed circuit board according to an example.

FIG. 9 is a diagram showing a PCB according to another example.

Referring to FIG. 9, the PCB includes an insulating material 100, a metal layer 200, and a via hole 300, and further includes an electroless plating layer 400 and an electroplating layer 500. The insulating material 100, the metal layer 200, and the via hole 300 have been described above, and thus detailed description thereof will be omitted.

The electroless plating layer 400 is continuously formed on the surface of the metal layer 200, the inner side surface of the via hole 300, and the upper surface of the conductor pattern P and may be formed of a metal material. The electroless plating layer 400 may be formed of a metal such as copper (Cu), silver (Ag), palladium (Pd), aluminum (Al), nickel (Ni), titanium (Ti), gold (Au), and platinum (Pt) or an alloy thereof.

The electroless plating layer 400 is formed by an electroless plating method. By using the electroless plating method, the electroless plating layer 400 is grown from the surface of the metal layer 200, the inner side surface of the via hole 300, and the upper surface of the conductor pattern P on which catalytic treatment has been performed.

The surface of the metal layer 200 on which the electroless plating layer 400 is disposed includes an upper surface of the metal layer 200 and an inner side surface of the metal layer 200.

The upper surface of the conductor pattern P may be a concave surface, and the electroless plating layer 400 may be formed along the concave surface of the upper surface of the conductor pattern P. In this case, the contact area between the conductor pattern P and the electroless plating layer 400 increases, and thus it is possible to improve adhesion therebetween.

The electroless plating layer 400 may have a smaller thickness than a thickness of the metal layer 200. The electroless plating layer 400 may have a thickness of 5 μm or less.

Since no protrusion of the fiber reinforcing material 110 is in the inner side surface of the via hole 300, the electroless plating layer 400 may be uniformly formed as a whole.

The electroplating layer 500 is formed on the electroless plating layer 400 and is formed through an electroplating method. By using the electroplating method, the electroplating layer 500 may be grown from the surface of the electroless plating layer 400 by electric current supplied through the electroless plating layer 400.

The electroplating layer 500 may protrude further than the upper surface of the via hole 300 and the upper surface of the metal layer 200. The electroplating layer 500 has a larger thickness than a thickness of the electroless plating layer 400.

Figure 10:
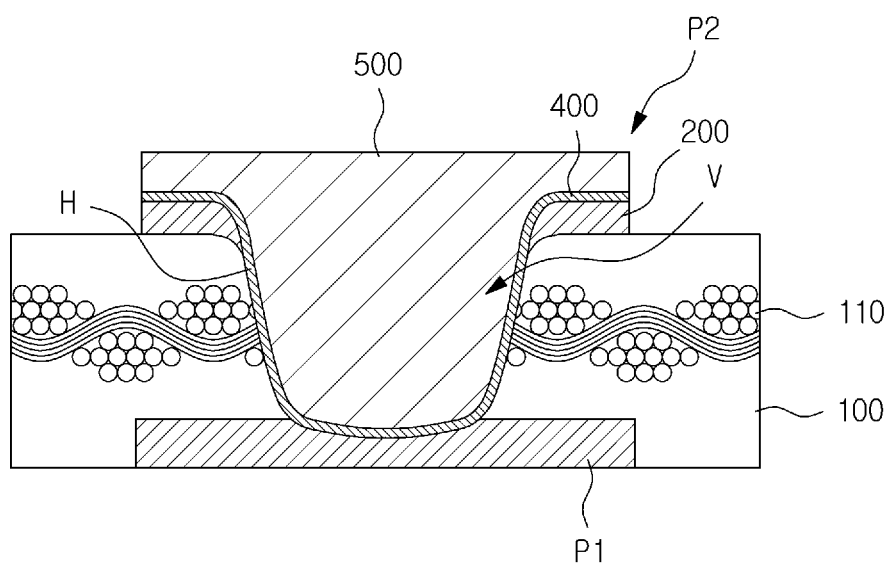
FIG. 10 is a diagram showing a printed circuit board according to an example.

FIG. 10 is a diagram showing a PCB according to another example.

Referring to FIG. 10, the PCB includes an insulating material 100, a lower conductor pattern P1, a via V, and an upper conductor pattern P2. The insulating material 100 has been described above, and thus detailed description thereof will be omitted. Also, the lower conductor pattern P1 is the same as the conductor pattern P that has been described, and thus detailed description thereof will be omitted.

The via V is connected to the lower conductor pattern P1 through the insulating material 100. The via V is formed by filling a hole H, which passes through the insulating material 100, with a conductive material. An inner side surface of the hole H may include a concave surface. Also, the hole H passes through a portion of the lower conductor pattern P1. An upper surface of the lower conductor pattern P1 through which the hole H passes may include a concave surface.

The via V includes an electroless plating layer 400 and an electroplating layer 500.

The electroless plating layer 400 is formed on the inner side surface of the hole H and the upper surface of the lower conductor pattern P1 and is formed by an electroless plating method. The electroless plating layer 400 may have a thickness of 5 μm or less.

The electroplating layer 500 is formed on the electroless plating layer 400 to fill the hole H. The electroplating layer 500 may be formed by an electroplating plating. The electroless plating layer 400 and the electroplating layer 500 may be formed of the same metal.

The upper conductor pattern P2 is formed on the upper surface of the via V. The upper conductor pattern P2 includes a metal layer 200, the electroless plating layer 400, and the electroplating layer 500.

The metal layer 200 is formed on the upper surface of the insulating material 100 in a ring shape around the circumference of the via V and is formed in the vicinity of the via V. The metal layer 200 may include a region with a thickness decreasing toward the via V. The metal layer 200 may have a smallest thickness in a portion closest to the via V. In the longitudinal section of the metal layer 200, the portion of the metal layer 200 closest to the via V may be sharp. An inner side surface of the metal layer 200 in contact with the via V may include an outwardly convex curved surface.

An interface between the insulating material 100 and the metal layer 200 may include a region that is downwardly directed toward the via V. The interface between the insulating material 100 and the metal layer 200 may be located at the lowest position in the portion closest to the via V. The interface between the insulating material 100 and the metal layer 200 may include a convex surface that is downwardly directed toward the via V.

The electroless plating layer 400 of the upper conductor pattern P2, which is an extension of the electroless plating layer 400 of the via V, is formed on the inner side surface of the metal layer 200 and the upper surface of the metal layer 200.

The electroplating layer 500 of the upper conductor pattern P2 is an extension of the electroplating layer 500 of the via V toward an upper side of the via V, and may be formed to protrude further than the metal layer 200.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   an insulating material;
   a metal layer stacked on a surface of the insulating material; and
   a via hole passing through the metal layer and the insulating material, wherein
   the metal layer decreases in thickness in a region adjacent to the via hole such that a boundary at which the insulating material contacts the metal layer is tapered toward the via hole to decrease the diameter of the via hole at the boundary.

2. The printed circuit board of claim 1, wherein the metal layer has a smallest thickness in the region adjacent to the via hole.

3. The printed circuit board of claim 1, wherein in a longitudinal section of the metal layer, a portion of the metal layer closest to the via hole is sharp.

4. The printed circuit board of claim 1, wherein an inner side surface of the metal layer facing the via hole includes an outwardly convex curved surface.

5. The printed circuit board of claim 1, wherein an interface between the insulating material and the metal layer is disposed at a lowest position of the interface closest to the via hole.

6. The printed circuit board of claim 1, wherein an interface between the insulating material and the metal layer includes an outwardly convex curved surface that is directed toward the via hole.

7. The printed circuit board of claim 1, wherein an inner side surface of the via hole passing through the insulating material includes a concave curved surface.

8. The printed circuit board of claim 1, further comprising a conductor pattern disposed inside the insulating material and in contact with the via hole, wherein
   the via hole passes through a surface of the conductor pattern.

9. The printed circuit board of claim 8, wherein the surface of the conductor pattern includes a curved surface.

10. The printed circuit board of claim 9, wherein the curved surface of the conductor pattern has a concave shape.

11. The printed circuit board of claim 8, further comprising:
    an electroless plating layer continuously disposed on a surface of the metal layer, an inner side surface of the via hole, and the surface of the conductor pattern; and
    an electroplating layer disposed on the electroless plating layer.

12. The printed circuit board of claim 1, wherein the insulating material includes a fiber reinforcing material, and the fiber reinforcing material does not protrude inside of the via hole.

13. The printed circuit board of claim 1, wherein the via hole comprises at least one surface substantially perpendicular to a planar direction of the insulating material.

14. The printed circuit board of claim 1, further comprising a conductor pattern disposed inside the insulating material and in contact with the via hole, wherein
    a surface of the conductor pattern through which the via hole passes comprises a flat surface.

15. A printed circuit board comprising:
    an insulating material comprising a lower conductor pattern disposed therein;

a via connected to the lower conductor pattern through the insulating material; and an upper conductor pattern disposed on an upper surface of the insulating material, wherein the upper conductor pattern comprises: a ring-shaped metal layer disposed on the upper surface of the insulating material; an electroless plating layer disposed on an inner side surface and an upper surface of the metal layer; and an electroplating layer disposed on the electroless plating layer, the metal layer decreases in thickness in a region adjacent to the via such that a boundary at which the insulating material contacts the metal layer is tapered toward the via to decrease the diameter of the via at the boundary.

* * * * *